US009287606B2

(12) United States Patent  
Tkach et al.

(10) Patent No.: US 9,287,606 B2  
(45) Date of Patent: Mar. 15, 2016

(54) DUAL-MODE MICROWAVE RESONATOR DEVICE AND METHOD OF ELECTRON SPIN RESONANCE MEASUREMENT (75) Inventors: Igor Tkach, Goettingen (DE); Marina Bennati, Bovenden (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 273 days.

(21) Appl. No.: 13/502,777

(22) PCT Filed: Jul. 27, 2010

(86) PCT No.: PCT/EP2010/004598
§ 371 (c)(1),
(2), (4) Date: Apr. 19, 2012

(87) PCT Pub. No.: WO2012/013202
PCT Pub. Date: Feb. 2, 2012

(65) Prior Publication Data
US 2014/0021952 A1 Jan. 23, 2014

(51) Int. Cl.
*G01R 33/345* (2006.01)
*G01R 33/60* (2006.01)
*H01P 7/00* (2006.01)

(52) U.S. Cl.
CPC .............. *H01P 7/00* (2013.01); *G01R 33/345* (2013.01); *G01R 33/60* (2013.01)

(58) Field of Classification Search
USPC ............................ 324/300–322; 600/407–435; 382/128–131; 219/690; 333/202–219, 333/24.2
See application file for complete search history.

(56) References Cited

U.S. PATENT DOCUMENTS 2,837,712 A * 6/1958 Mackey .................... 324/316  
3,128,439 A * 4/1964 Brown, Jr. et al. ........... 333/24.2  
(Continued)

FOREIGN PATENT DOCUMENTS

WO    2009121630 A1    10/2009  
WO    WO 2009121630 A1 * 10/2009 ........... G01R 33/345

OTHER PUBLICATIONS

Tkach et al., "W-band PELDOR with a dual-mode microwave resonator" The 43rd Annual International Meeting of the Electron Spin Resonance Spectroscopy Group of the Royal Society of Chemistry; Mar. 21, 2010; p. P35.  
Sloop et al. "Two cavity device as a bimodal cavity" Review of Scientific Instruments USA; vol. 39; No. 8; Aug. 1968; pp. 1215-1216, XP 002631192.  
Tkach et al. "A dual-mode microwave resonator for double electron-electron spin resonance spectroscopy at W-band microwave frequencies" Journal of Magnetic Resonance; vol. 209; No. 2; Apr. 2011; pp. 341-346; XP 002631193.

(Continued)

*Primary Examiner* — Dixomara Vargas  
*Assistant Examiner* — Tiffany Fetzner  
(74) *Attorney, Agent, or Firm* — Caesar Rivise, PC (57) ABSTRACT

A microwave resonator device (1), being configured in particular for electron spin resonance measurements, comprises a resonator being resonant with first and second microwave field modes and including first and second resonance sections (7, 8) arranged along a longitudinal axis (2) of the resonator, and a coupling unit being arranged between the first and second resonance sections, wherein the coupling unit includes a conducting plate (16) being arranged on the longitudinal axis (2) and covering a central portion of a cross-sectional area of the resonator, the conducting plate (16) is adapted to adjust a first mode frequency of the first microwave field mode, and the conducting plate (16) is arranged at a field minimum of the second microwave field mode. Furthermore, a method of conducting an electron spin resonance measurement with a sample to be investigated is described.

16 Claims, 8 Drawing Sheets

(56) References Cited

U.S. PATENT DOCUMENTS

| | | | | |
|---|---|---|---|---|
| 3,205,432 | A | * | 9/1965 | Cochran ................... 324/316 |
| 3,214,684 | A | * | 10/1965 | Everitt ..................... 324/318 |
| 3,441,837 | A | * | 4/1969 | Parouty et al. ............. 324/301 |
| 3,529,235 | A | * | 9/1970 | Day .......................... 324/316 |
| 4,633,180 | A | | 12/1986 | Biehl et al. |
| 4,791,392 | A | * | 12/1988 | Brunner et al. ............ 333/219 |
| 5,250,773 | A | * | 10/1993 | Lind et al. ................. 219/690 |
| 5,345,203 | A | | 9/1994 | Gentsch et al. |
| 5,596,276 | A | | 1/1997 | Nakagawa et al. |
| 5,598,097 | A | | 1/1997 | Scholes et al. |
| 5,949,311 | A | * | 9/1999 | Weiss et al. ............... 333/202 |
| 7,292,112 | B2 | * | 11/2007 | Oxborrow ............... H01P 7/10 331/96 |
| 7,391,212 | B2 | | 6/2008 | Maier et al. |
| 7,586,305 | B2 | | 9/2009 | Hofer et al. |
| 8,570,033 | B2 | * | 10/2013 | Prisner et al. ............. 324/307 |
| 2006/0197529 | A1 | | 9/2006 | Geifman et al. |
| 2007/0001773 | A1 | * | 1/2007 | Oxborrow ............... H01P 7/10 331/154 |
| 2009/0230963 | A1 | | 9/2009 | Krahn et al. |
| 2011/0050225 | A1 | * | 3/2011 | Prisner et al. ............. 324/307 |
| 2012/0074944 | A1 | * | 3/2012 | Leussler ................... 324/322 |
| 2014/0021952 | A1 | * | 1/2014 | Tkach et al. .............. 324/316 |

OTHER PUBLICATIONS

Polyhach et al. "Spin pair geometry revealed by high-field DEER in the presence of conformational distributions" Journal of Magnetic Resonance; vol. 185; 2007; pp. 118-129.

Goldfarb et al. "HYSCORE and DEER with an upgraded 95 GHz pulse EPR spectrometer" Journal of Magnetic Resonance; vol. 194; 2008; pp. 8-15.

Sicoli et al. "Effects in 94 GHz Orientation-Selected PELDOR on a Rigid Pair of Radicals with Non-Collinear Axes" Appl. Magn. Reson.; vol. 37; 2010; pp. 539-548.

Tkach et al. "W-band Fabry-Perot microwave reasonators for optical detected electron paramagnetic resonance and electron nuclear double resonance of paramagnetic defects in solids" Review of Scientific Instruments; vol. 75; 2004; pp. 4781-4788.

Tkach et al. Experimental aspects of orientation selective PELDOR in W-band; P688.

Bennati, "Studies of Dynamic Nuclear Polarization (DNP) in Liquids: Understanding the Overhauser Mechanism for New Experimental Designs" (Abstract of presentation at Joint Euromar 2010 and 17th ISMAR Conference, Florence, IT, Jul. 4-9, 2010).

International Search Report for PCT/EP2010/004598 dated Apr. 28, 2011.

\* cited by examiner

DUAL-MODE MICROWAVE RESONATOR DEVICE AND METHOD OF ELECTRON SPIN RESONANCE MEASUREMENT

SUBJECT OF THE INVENTION

The present invention relates to a microwave resonator device including a dual-mode microwave resonator, in particular for double electron spin resonance spectroscopy or for microwave filtering. More specifically, the invention relates to a dual-mode microwave resonator device configured for double electron-electron spin echo experiments (PELDOR, also called DEER) performed at W-band microwave frequencies (at and near 94 GHz). Furthermore, the present invention relates to a method of measuring electron spin resonances using the dual-mode microwave resonator device, in particular a method of double electron spin resonance spectroscopy. The invention can be applied in particular in the field of electron spin resonance (ESR, also EPR: electron paramagnetic resonance) spectroscopy.

TECHNICAL BACKGROUND

Atoms and molecules with unpaired electrons possess a magnetic moment generated by the electron-spin angular momentum. The magnetic moment can be detected by electron spin resonance techniques at concentrations as small as a few picomoles. Since the electron magnetic moment is sensitive to magnetic interactions at the atomic scale, it becomes an ideal probe in a variety of research areas, from material science to structural biology. For executing experiments on paramagnetic samples by an ESR device, both an intensive microwave magnetic field and an orthogonally oriented static magnetic field at the sample position are used for exciting electron spin resonance transitions within the sample. The static magnetic field is commonly produced by a magnet system of an electron spin resonance spectrometer.

Modern ESR spectroscopy relies on a repertoire of many different continuous-wave and pulsed techniques. Among the most important ones is the pulsed electron-electron double resonance technique (PELDOR, also called DEER) which permits to measure long range distances (2-10 nm) between two paramagnetic species or spin labels in (bio)macromolecules such as nucleic acids, proteins, etc. by monitoring their dipolar interaction. The resolution of the PELDOR experiment increases at higher polarizing fields where the local symmetry of the electron wave function, which is reflected in so-called g-tensor values, is well resolved. In this case, the angular dependence of the dipolar interaction can be more accurately recorded and analysed. As an example, for spin labels based on nitroxide radicals commonly used in spin labelling of diamagnetic biomacromolecules, these fields are above 3T, corresponding to the excitation microwave frequencies above 90 GHz.

Conventionally, various structures have been established for providing monochromatic irradiation through a single mode resonator. However, to perform PELDOR experiments, two microwave frequencies are required. One frequency, called "observer" frequency, is applied to monitor a specific region of the electron paramagnetic resonance spectrum and a second frequency, called the "pump" frequency, is applied to other regions of the ESR spectrum to excite the second spin in the pair. Because two microwave frequencies are used, the bandwidth of the ESR microwave resonator is crucial. In a conventional experiment, the "observer" frequency is set to the centre of a resonance dip of the resonator. As a consequence, the "pump" frequency is placed on the side of the resonator dip, where the pumping efficiency is not as good as at the centre of the dip. On commercial W-band single mode resonators the frequency difference can be set only in the range of $\Delta f=20\text{-}60$ MHz (see Y. Polyhach et al. in "Journal of Magnetic Resonance" vol. 185, 2007, p. 118-129; and D. Goldfarb et al. in "Journal of Magnetic Resonance" vol. 194, 2008, p. 8-15). This is not sufficient to detect all possible orientations for radicals in a pair. The latter is a crucial information to study conformational changes of macromolecules, e.g. biological macromolecules (biomacromolecules). To do this one has to separate the "pump" and "observer" frequencies up to $\Delta f=200\text{-}350$ MHz. With a single mode resonator, particularly at frequencies above 90 GHz, this is impossible. A recent attempt to employ a low-Q single mode resonator for ELDOR experiments with Of up to 150 MHz (see G. Sicoli et al. "Appl. Magn. Reson." vol. 37, 2010, p. 539-548) revealed a considerable decrease in signal sensitivity. This demonstrated that the approach of a low-Q resonator is not the right concept at high frequencies. There is a need for a dual-mode resonator, in which the frequency separation up to 350 MHz would be possible. Another point is that the frequency separation, $\Delta f$, should be tuneable.

Generally, a microwave cavity is one of the critical parts of each ESR spectrometer as the cavity influences the spectrometer performance. This is particularly true for high microwave frequencies where constraints become larger. The available microwave sources for such frequencies usually have a narrow range of frequency generation (~400 MHz). Therefore a capability of varying the resonance frequency in a broad range is desired.

Another problem encountered is the usual need for low temperature measurements. ESR/PELDOR experiments are performed mostly at low temperatures (T~5-70 K). These low temperatures are to be stably kept over a long time during the signal accumulation (e.g. up to 60 h), i.e. the resonator should fit into a He-flow cryostat of the ESR spectrometer, should be capable to be efficiently evacuated, and tuning should be performed from the top of the cryostat. The sample usually is inserted into the resonator with a special holder (~1.5 m long). This complicates the design of any resonator. Furthermore, orientation of the microwave magnetic fields ($B_1$ in ESR nomenclature) should be orthogonal to the statically applied magnetic field ($B_0$). Finally, the quality factor, Q, of the resonator is to be efficiently high to produce strong magnetic fields at the sample position and the cavity coupling to a microwave source should be precisely adjusted. Any small perturbation of the resonator geometry reduces its quality thus reducing magnetic field intensity of the microwave mode and therefore an ESR effect.

Dual-mode microwave resonators are generally known in practice (see for example: Bruker ER4116DM dual mode resonator, Bruker BioSpin), which however are adapted for X band frequencies only (e.g. about 9 GHz) and the resonance frequencies of the modes are fixed. Furthermore, the polarization directions of the microwave fields of the two modes are perpendicular to each other. Thus, these conventional resonators are suitable for ESR measurements of symmetry-forbidden transitions only. Furthermore, various configurations of multi-mode Fabry-Perot microwave resonators are generally known (see for example: I. Tkach et al. in "Review of Scientific Instruments" vol. 75, 2004, p. 4781-4788). However, these resonators are not capable of a simultaneous excitation of a sample at different microwave frequencies.

U.S. Pat. No. 5,598,097 discloses an apparatus for ESR measurements including two or more cylindrical resonators wherein a single resonance frequency of the apparatus can be tuned by changing a distance between the cylindrical resonators.

OBJECTIVES OF THE INVENTION

It is an objective of the invention to provide an improved microwave resonator device being capable of a dual mode operation and avoiding disadvantages and limitations of conventional techniques. In particular, the microwave resonator device is to be capable of being resonant with two microwave field modes having equal polarizations but different frequencies, especially at high microwave frequencies (W-band). According to a further particular aspect, the objective is to provide a dual-mode resonator device, wherein the frequency difference between two microwave modes can be adjusted during an experiment. Furthermore, it is an objective of the invention to provide an improved method of electron spin resonance measurements using the dual-mode microwave resonator device.

SUMMARY OF THE INVENTION

According to a first aspect of the invention, a microwave resonator device including a resonator with first and second resonator sections is provided, which are separated by a coupling unit, which couples the two resonator sections such that at least two resonator modes are supported by the resonator, which oscillate at different frequencies. The first and second resonator sections are arranged along a longitudinal axis of the resonator. The microwave field modes extend in the longitudinal direction of the resonator. The resonator is shaped and dimensioned (sized) such that various microwave field modes, e.g. a fundamental microwave field mode (in the following: first microwave field mode, here in particular $TE_{011}$) and a higher harmonic microwave field mode (in the following: second microwave field mode, here in particular $TE_{012}$), can be excited simultaneously. The coupling unit includes a plane, electrically conducting plate, which separates the first and second resonator sections from each other. Advantageously, the conducting plate is configured such that the first microwave field mode (in particular the fundamental microwave field mode) is modified while the second microwave field mode (in particular the higher harmonic microwave field mode) is kept unaffected. In particular, the conducting plate can be arranged outside of a field minimum of the first microwave field mode.

According to the invention, the conducting plate is arranged on the longitudinal axis of the resonator such that a central portion of a cross-sectional area of the resonator is covered.

In radial direction, i.e. perpendicular to the longitudinal axis, the conducting plate is circumferentially surrounded by a spacing. Preferably, the outer shape of the conducting plate is geometrically similar with the inner shape of the resonator. As an example, a circular plate can be provided in a cylindrical resonator, while a rectangular plate can be provided in a rectangular resonator. Through the spacing between the conducting plate and an inner wall of the resonator or optionally slabs surrounding the plate, the first and second resonator sections communicate, optionally through a dielectric window material. The conducting plate is arranged at a predetermined location on the longitudinal axis, where the second microwave field mode (here in particular $TE_{012}$) has a field minimum, i.e. a node. Accordingly, this mode is almost unaffected by the conducting plate. Advantageously, this arrangement eliminates a degradation of the higher harmonic mode and permits its excitation with a high quality. The resonance frequency of this mode is determined by its configuration ($TE_{012}$) and by the total dimension of the resonator (first and second resonator sections). Furthermore, the frequency of the first microwave field mode, i.e. the fundamental microwave field mode (here in particular $TE_{011}$) is determined by an effective dimension of the first resonance section.

The inventors have found that the frequency of the first microwave field mode depends on a thickness of the conducting plate and a radial width of the spacing around the plate. Furthermore, the inventors have found that with the change of the size of the conducting plate or position of slabs optionally surrounding the plate, the mode frequency of the first microwave field mode can be adjusted relative to the mode frequency of the second microwave field mode, while the mode configuration (mode type) is kept unchanged and that both modes have the same magnetic field polarization in the first resonator section, in particular at a sample location therein. Thus, the mode frequency of the first microwave field mode can be adjusted by selecting a plate with a predetermined thickness and diameter. Practical dimensions of the plate can be selected in dependency of microwave field requirements of the particular application of the invention, in particular using numerical simulations based on a solution of the Maxwell equations or based on reference tables.

The coupling unit of the microwave resonator device can be considered as an independent subject of the invention. It is particularly configured to form the dual mode resonance arrangement in a cylindrical resonator for a dual frequency excitation of a paramagnetic sample by two different microwave modes of a cylindrical configuration with the same magnetic field polarization at the sample location.

The microwave resonator device provides a bimodal resonator assembly, in particular for executing measurements on paramagnetic samples by a device for double electron-electron paramagnetic resonance spectroscopy, said resonator assembly having adjacent resonance sections, preferably with cylindrical shape, one of which being capable of accommodating a device for positioning a paramagnetic sample, the resonator being able to be resonant in the two different modes which oscillate at different frequencies with the same field polarization at the sample position, so that the magnetic fields of both modes interact with the paramagnetic sample. As a particular advantage, the inventive microwave resonator device allows the selection of an enlarged frequency spacing compared with the conventional techniques, while a high quality factor of the first and second microwave field modes is kept. The proposed device has a relatively simple structure which can be easily operated and manufactured.

According to a second aspect of the invention, a method of conducting an electron spin resonance measurement is provided, wherein the microwave resonator device according to the above first aspect is used. The inventive method comprises the step of positioning a sample to be investigated in the first resonator section, adjusting a first mode frequency of the first microwave field mode, adjusting a second mode frequency of the second microwave field mode above the first mode frequency, so that the first and second mode frequencies are separated by a predetermined frequency spacing, and collecting electron spin resonance signal excited in the sample. Advantageously, the frequency separation between the two modes (preferably cylindrical modes) in the bimodal resonator assembly can be adjusted to efficiently perform orientation selective double electron-electron resonance experiments by varying the frequency separation of the microwave modes during the experiments.

The invention has the following further characteristics and advantages. The dual-mode microwave resonator device is particularly adapted for W-band frequencies, e.g. 94 GHz (+/−500 MHz), electron spin resonance and double electron-electron paramagnetic resonance experiments, in order to gain information on relative distances and orientations of paramagnetic species or spin labels in different materials or macromolecules, in particular bio-macromolecules. A paramagnetic sample can be placed in one of the resonator sections at the location of the maximum magnetic field strength of both first and second microwave modes. The microwave resonator device is constructed in the manner to allow an excitation of a paramagnetic specimen at one frequency and detection of the response at another frequency. The microwave magnetic field polarization of both first and second microwave modes is the same in one of the resonator sections, in particular at the position of the paramagnetic sample. In other words, magnetic field strength vectors of both microwave modes are collinear. Furthermore, the microwave magnetic field polarization is perpendicular to the orientation of a static magnetic field, which can be produced by a superconductive magnet e.g. of commercial W-band (94 GHz) ESR spectrometers (like ElexSys 680, Bruker BioSpin GmbH). Advantageously, the microwave fields of both modes can be made sufficiently strong at the sample position to efficiently induce the ESR transitions at both microwave frequencies with microwave pulses. The microwave resonator device can be operated within a broad temperature range and fits into conventional liquid He cryostats, like a He cryostat of a commercial W-band (94 GHz) ESR spectrometer to perform low temperature experiments (down to liquid He).

According to a preferred embodiment of the invention, the coupling unit of the microwave resonator device includes lateral conducting slabs, which surround the conducting plate. Advantageously, the conducting slabs together with the conducting plate form a slit-shaped spacing through which the first and second resonator sections are coupled. Adjustment of the radial width of the slit (width perpendicular to the longitudinal axis of the resonator) allows an adjustment of the resonance frequency of the first (fundamental) microwave field mode.

According to a particularly preferred embodiment, the lateral conducting slabs are movable, so that the radial width of the slit can be changed. Accordingly, a frequency adjustment, in particular an adjustment of the frequency spacing between the first and second mode frequencies can be obtained. Thus, the frequency spacing of the two microwave modes can be tuned by the coupling unit in particular for performing orientation selective double electron-electron resonance experiments. According to a further advantageous embodiment, both lateral conducting slabs are moved with a common drive unit, which is configured for a simultaneous adjustment movement of the slabs. The drive unit provides a mechanism which is capable to adjust the frequency difference between the two microwave modes during the operation of the resonator device, in particular during the ESR experiment, in a broad frequency range (up to 400 MHz).

According to further advantageous embodiments of the invention, the frequencies of the microwave field modes of the resonator can be adjusted by both of first and second adjustment pistons, which are arranged in the first and second resonator sections, respectively. With an adjustment of the adjustment pistons, the longitudinal length of the resonator can be set resulting in a certain frequency of the fundamental microwave field mode and corresponding frequencies of the higher harmonic microwave field mode.

If according to a particularly advantageous embodiment of the invention, a frequency setting device is provided, which is capable of setting the adjustment positions of at least one of the first and second adjustment pistons, controlling the microwave resonator device, e.g. during an ESR measurement can be facilitated. According to a particularly preferred embodiment, the frequency setting device is configured for a synchronous setting of the adjustment positions of both adjustment pistons. Thus, the frequencies of the microwave modes can be tuned synchronously (linked), i.e. with the same frequency separation, by the two pistons to adjust the frequencies of both modes within a generation range of two different microwave sources coupled with the resonator device. Advantageously, the frequencies of both microwave modes can be tuned in a broad frequency range (~1 GHz). This characteristic is particularly important at high microwave frequencies, where commercially available microwave sources have a narrow range of the generation only.

By providing both of the frequency setting device to adjust the resonator dimensions of both resonator sections as well as the drive unit for the adjustable coupling between the sections, a dual-mode resonance configuration is created, which is capable to tune the frequency position of both modes and to change the frequency separation between the modes, in particular during an ESR experiment.

According to a preferred application of the invention, the microwave resonator device is used for conducting electron spin resonance measurements. To this end, the adjustment piston arranged in the first resonator section has a concentric opening, through which a sample can be introduced into the first resonator section.

Furthermore, for conducting the electron spin resonance measurement, one of the first and second resonator sections preferably includes a coupling opening (coupling iris), to which an in-coupling waveguide is connected. The coupling iris is located at a point in the resonator, where the microwave magnetic field strength is maximum and has the same orientation as the magnetic field of a dominant mode in the waveguide. Preferably, the waveguide is connected with two separate microwave sources, which can be adjusted to the first and second microwave mode frequencies of the resonator, respectively.

As a further advantage of the invention, there are no particular restrictions with regard to the shape of the resonator of the inventive microwave resonator device. As preferred examples, the resonator may have a rectangular cross-sectional shape or a cylindrical shape. In particular, for the electron spin resonance measurement application, the cylindrical shape of the resonator is preferred. As an advantage of the cylindrical resonator, the maximum field strength of both of the first and second microwave field modes is located at the same position in the first resonator section, so that the sample can be kept at this position during the measurement. With other applications, e.g. for filtering microwaves, the rectangular resonator shape can be used as well. The cylindrical configuration is, however, preferred. With the filtering applications, the inventive microwave resonator device provides a filter, which is adjustable in a broad frequency range.

According to a preferred embodiment of the invention, the conducting plate of the coupling section is arranged at a half longitudinal length of the resonator. In this case, the conducting plate is arranged at the field minimum of the second (higher harmonic) microwave field mode. If another higher harmonic frequency mode is used (for example $TE_{013}$, $TE_{014}$, etc.) as the second microwave field mode, another position along the longitudinal axis of the resonator can be selected.

Furthermore, the conducting plate is preferably arranged perpendicularly to the longitudinal axis of the resonator. With the perpendicular arrangement, a perturbation of the second microwave field mode can be minimized.

According to further preferred embodiments of the invention, the conducting plate has a diameter of at least 2.2 mm, in particular at least 3.2 mm, and/or a thickness below 200 μm, in particular below 100 μm. The inventors have found that these parameters result in particular advantages for adjusting the first and second microwave mode frequencies for electron spin resonance measurements.

BRIEF DESCRIPTION OF THE DRAWINGS

Further details and advantages of the invention will be described in the following with reference to the attached drawings, which show in.

PREFERRED EMBODIMENTS OF THE INVENTION

Figure 1:
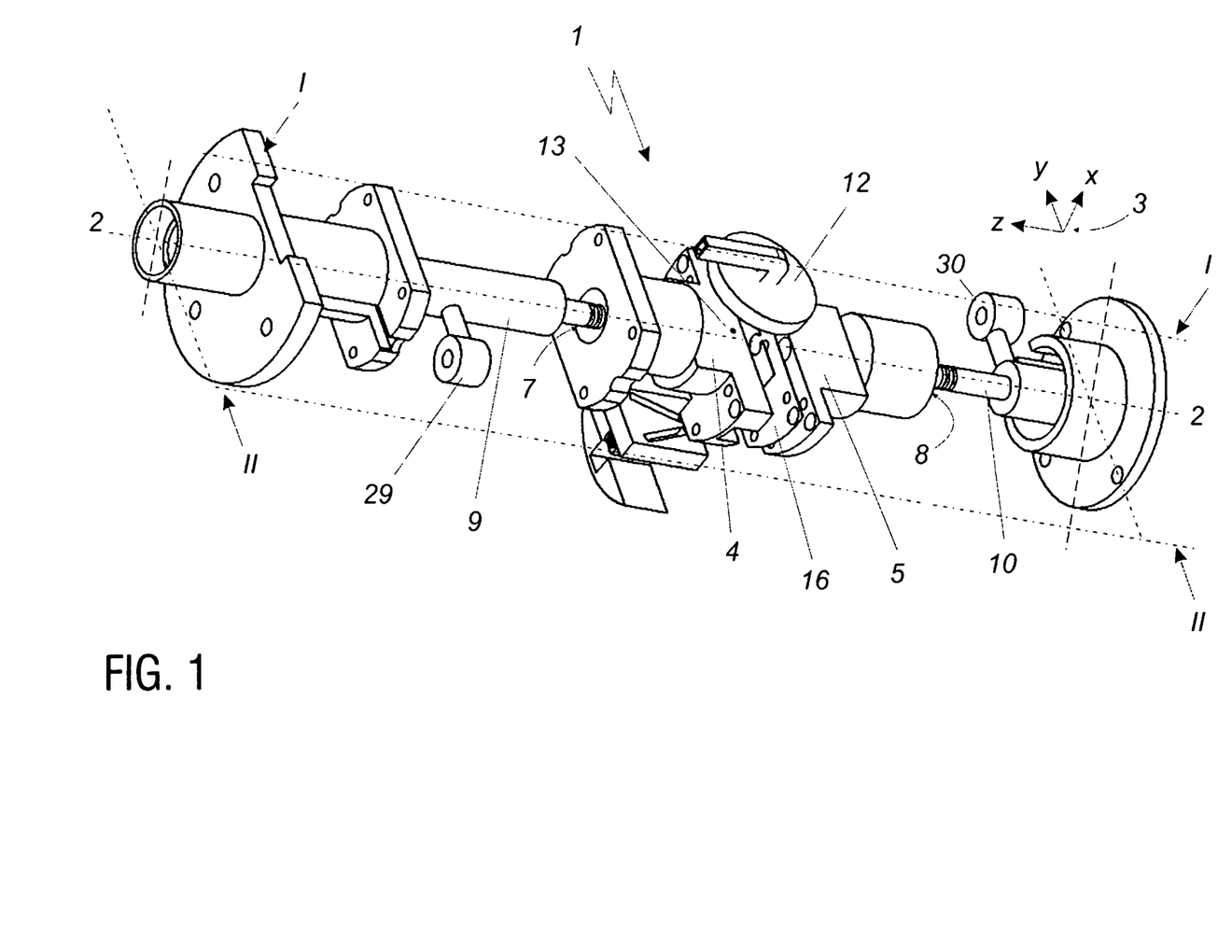
FIG. 1 a perspective view of the microwave resonator device according to a preferred embodiment of the present invention.
Figure 2:
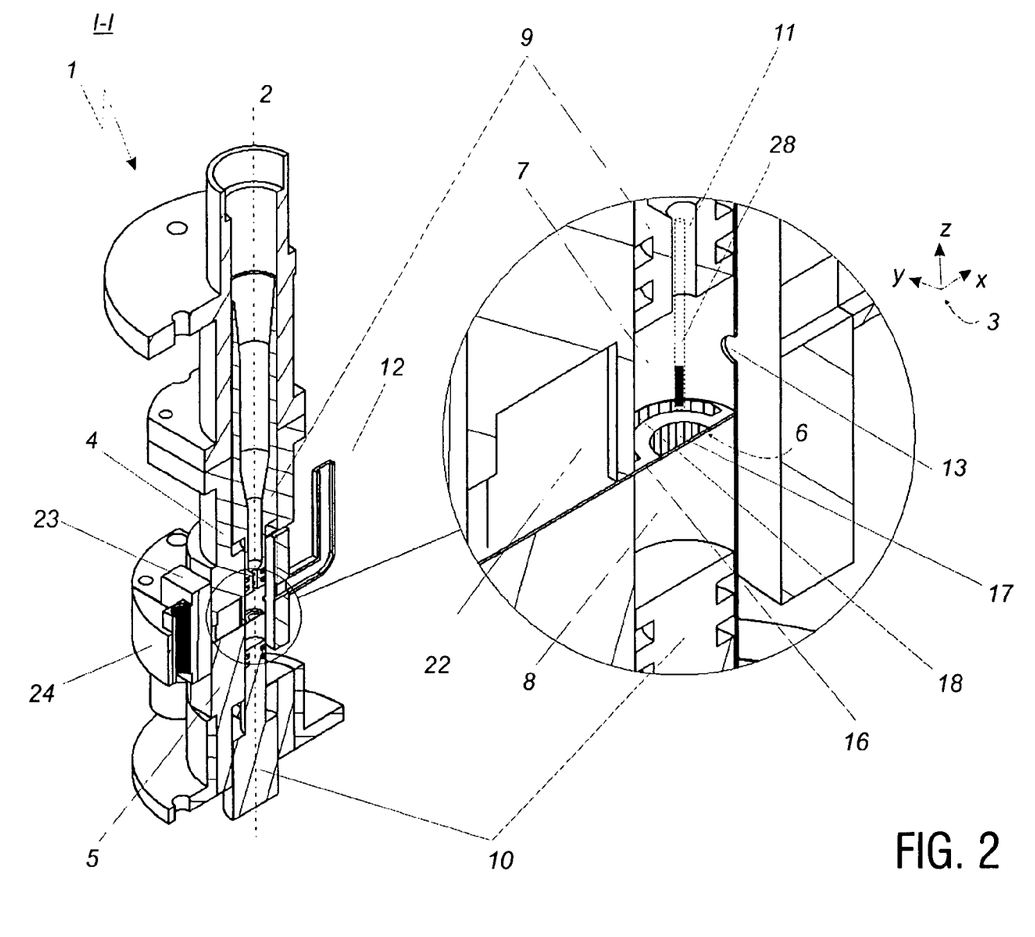
FIG. 2 the I-I sectional view of the assembled microwave resonator device.
Figure 3:
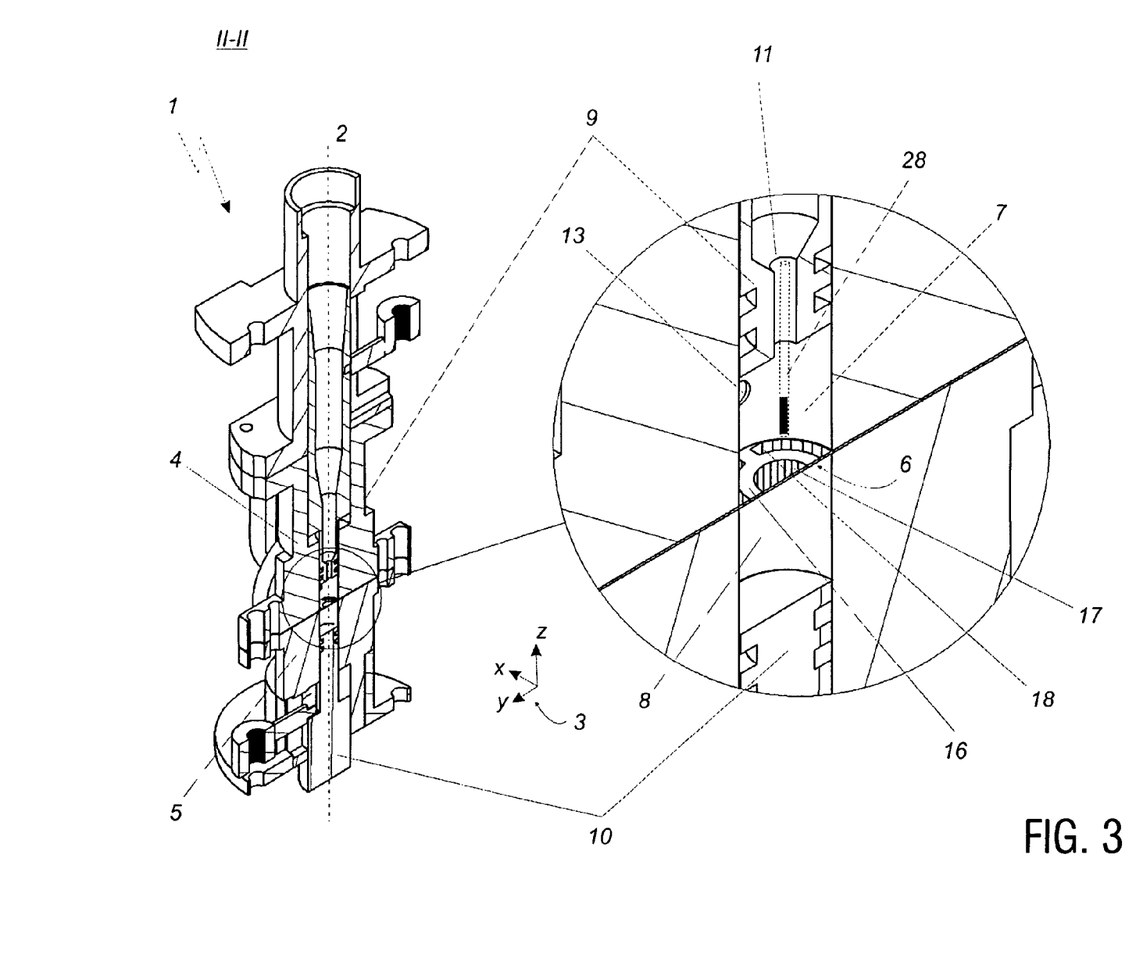
FIG. 3 the II-II sectional view of the assembled microwave resonator device.

The general design of the dual-mode microwave resonator device is presented in the FIG. 1. The cross sections I-I and II-II of the assembled resonator with details of a junction between the resonance sections are sketched in FIG. 2 and FIG. 3, respectively. For ESR measurements, the dual-mode microwave resonator device is combined with further components of an ESR device (ESR spectrometer), like a magnet device providing a static magnetic field and a microwave source/detection system to induce and detect ESR signals. These components of the ESR device are not described in detail as they are designed as conventionally known from ESR technique.

The preferred embodiment of the microwave resonator device is referenced by numeral 1. The resonator extends along the longitudinal axis 2 which coincides with the z axis of the Cartesian coordinate system indicated by 3. The basic architecture of the resonator can be described as two cylindrical hollow resonance sections 7 and 8 provided in the sections 4 and 5 axially connected to each other and separated by the coupling unit 6 (see FIGS. 2 and 3).

As an example, the diameter of the hollow resonator sections 7 and 8 in the preferred embodiment for 94 GHz is equal to 4.16 mm. There are two pistons 9 and 10, each at the end of each section, which face each other and can be moved symmetrically along the main axis 2 inside the hollow sections 7 and 8. The axes of the sections 4 and 5 as well as the axes of the pistons 9 and 10 extend along the main axis of the assembly. The pistons having diameters of e.g. 4.14 mm delineate the top and the bottom of the joint resonance compartment formed by hollow sections 7 and 8.

The distance between the pistons can be changed e.g. from 3 to 20 mm by twisting the tuning shafts (not shown for simplicity) through the fine thread of the frequency setting device 29, 30. This function is implemented for two reasons: 1) to adjust the frequencies of both modes to the output frequencies of two microwave sources, and 2) to tune the mutual position of the pistons 9 and 10 in respect to the coupling junction 6 in order to adjust the proper condition leading to a dual-mode excitation in the resonator.

The piston 9, which shorts the resonance section 7, has a concentric opening 11 (FIG. 2) to introduce a paramagnetic sample into the resonator. The concentric opening 11 has a diameter of e.g. 1.1 mm. A sample tube 28 with a liquid or solid specimen can be guided and inserted into the upper resonance section 7 with a sample holder.

The coupling with the WR10 rectangular waveguide, which connects the microwave resonator device to two microwave sources (not shown, indicated in FIG. 2 as 12), is performed via a small iris 13 from the back side of the upper section 4. The coupling should be made in the manner that the magnetic field orientation of the dominant $TE_{10}$ mode propagating in the waveguide is parallel to the longitudinal axis 2 of the resonator. The diameter of the coupling iris 13 in the preferred embodiment equals to 0.9 mm. The iris is located at the point where the microwave magnetic field strength induced in the resonance section 7 is maximal and has the same orientation as the magnetic field of the dominant mode in the waveguide. To avoid undesirable losses of the microwave power the thickness of the wall around the iris should be minimized (preferably less than 50 μm). All parts of the resonator, except the coupling unit 6, can be made of brass. To increase the conductivity of the microwave skin-layer in the hollow sections 7 and 8, and thus the quality of the resonator, and to protect the resonator's surfaces from oxidizing a gold coating can be used.

The coupling unit 6, which separates the resonance sections 7 and 8, and the drive unit 20 (FIG. 4) are provided to form the dual-mode resonance arrangement and to change the frequency separation between the modes. Both units are sketched in details in the FIGS. 4 and 5. The coupling unit 6 includes a lossless dielectrical window 16 made e.g. from mica or PTFE, in particular Teflon Fiberglass®; a thin plate of conductor (e.g. sheet of copper foil) 17; and two lateral conducting (e.g. gold coated brass) slabs 18 and 19. The drive unit 20, which is provided to move the slabs 18 and 19, comprises two sliders 21 and 22, a vertically moveable slab 23, a cover 24, and a shaft 25.

The dielectrical window 16 is covered with the conducting plate 17, which forms a disk-shaped conducting surface between hollow sections 7 and 8. The thickness and the material of the window 16 as well as the material, the thickness and the radius of the conducting plate 17 determine the frequency separation between the working modes. In the preferred embodiment (frequencies near 94 GHz) with the 0.1 mm mica window and the 0.1 mm thick copper plate 17, the 1.1 mm radius is chosen for the plate 17 to set the initial frequency separation close to 480 MHz. If necessary, larger frequency separations are possible (up to 4 GHz) with the smaller radius of the plate 17. For EPR and PELDOR spectroscopy, the larger frequency separations are inexpedient due to the narrow bandwidths of commercial microwave sources restricting the tuning of the dual-mode resonator. However, other applications of the device (e.g. tuneable dual-mode filters) would be feasible.

The conducting plate 17 covers the dielectrical window 16 and is placed between two resonance sections 7 and 8 in the xy plane perpendicular to the longitudinal axis 2. The center of the plate lies on the axis 2. Such a configuration forms a resonance structure being able to support standing waves of microwave modes essential for EPR experiment, i.e. with the magnetic field maximum on the longitudinal axis 2.

Figure 6:
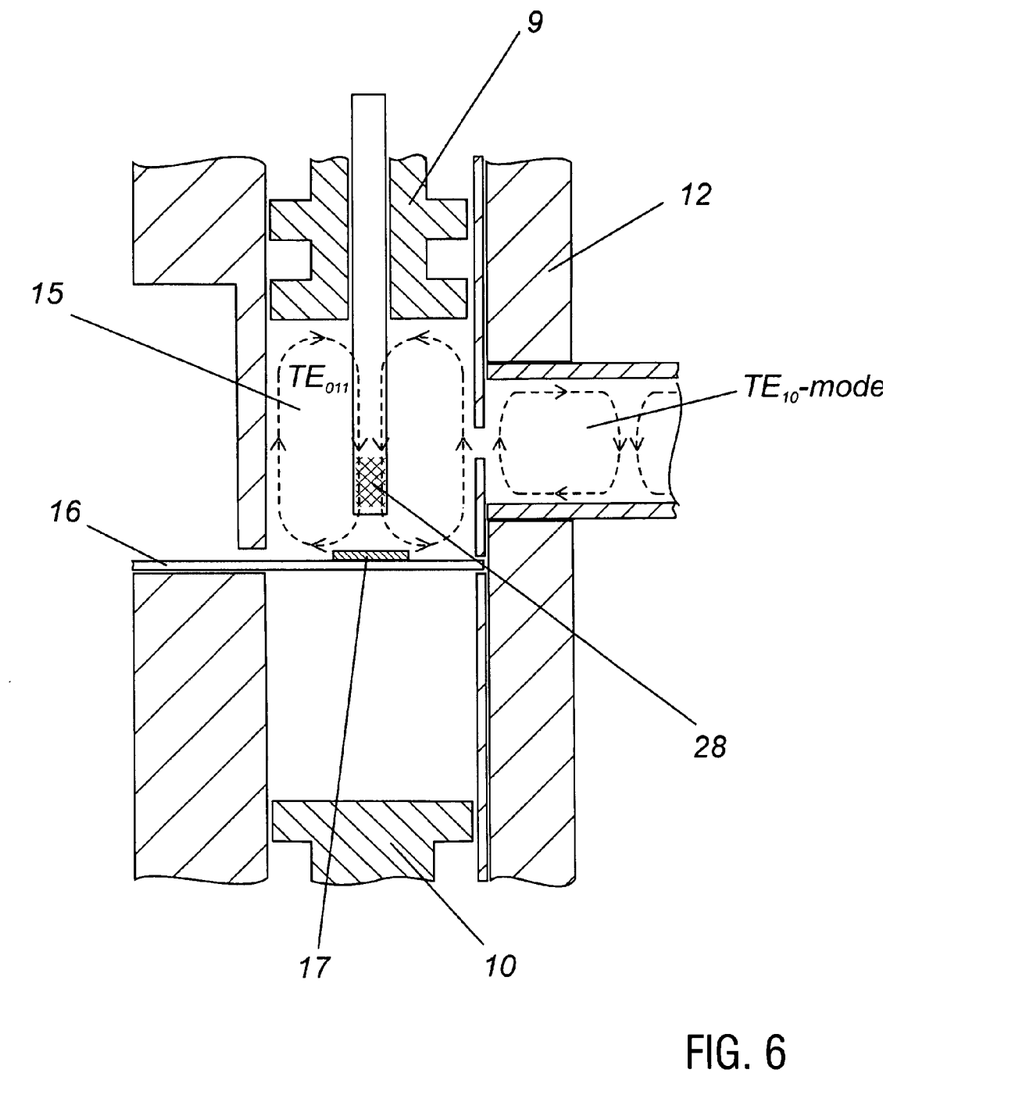
FIG. 6 the resonance sections with the indication of the standing wave pattern of the first (here $TE_{011}$) resonance mode in the dual-mode resonator.
Figure 7:
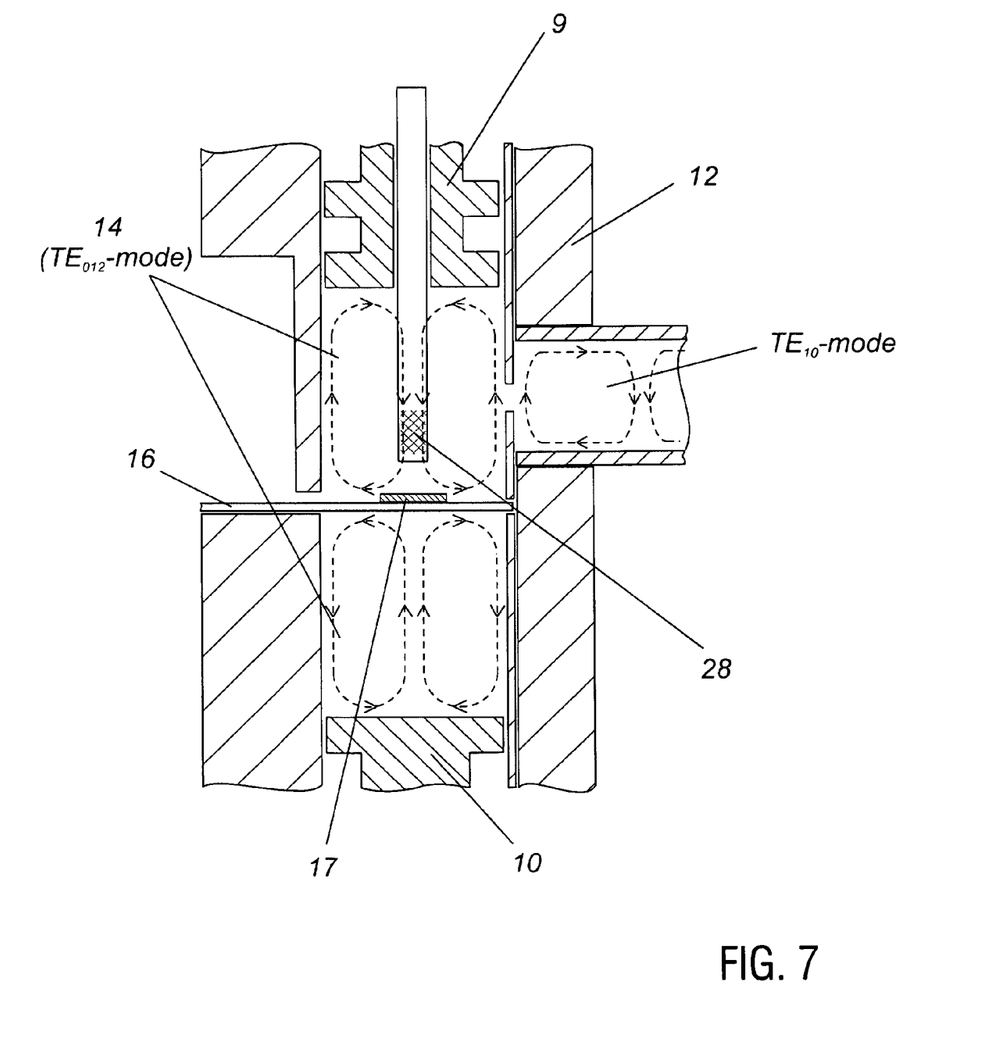
FIG. 7 the resonance sections with the indication of the standing wave pattern of the second (here $TE_{012}$) resonance mode in the dual-mode resonator.

FIG. 6 shows in schematic manner the magnetic field standing wave pattern 15 of one of the modes, which is a common mode of the $TE_{011}$ cylindrical configuration appearing at lower resonance frequencies. This mode oscillates in the resonance section 7. The standing wave pattern of the second mode, which appears at higher frequencies while tuning the resonator, is a microwave mode of the $TE_{012}$ cylindrical configuration, which oscillates in both the resonance section 7 and the resonance section 8. The mode is shown in FIG. 7 under reference numeral 14. The standing wave patterns 14 and 15 are results of numerical simulations performed using the CST Microwave Studio Suite™ 2009 package (CST—Computer Simulation Technology AG, Darmstadt, Germany).

For EPR or PELDOR experiments the paramagnetic sample 28 is supposed to be placed at the axis of the resonance section 7, which is preferred due to a restricted homogeneity of the static magnetic field along the axis 2. To excite both modes at the sample position, it is provided to support the $TE_{012}$ mode in the whole resonance compartment. For that, it is preferred to have the conducting plate 17 in the middle of the resonance compartment between the half wavelength variations of the standing wave pattern of the $TE_{012}$ mode, i.e. in the minimum of its magnetic (and electric) field strength. A slight deviation (up to 0.2 mm) is acceptable, however it leads to a partial degradation of the dual mode configuration. Larger deviations cause a complete degradation of the $TE_{012}$ mode, and thus the degradation of the dual-mode configuration with the modes oscillating at the sample position.

In order to avoid the degradation of the $TE_{012}$ mode while incorporating the sample 28 into the section 7, the tuning of both sections 7 and 8 is provided independent to compensate the change of the resonance conditions in the section 7. However, by converse movement of the pistons 9 and 10 it is possible to change the longitudinal dimensions of the resonance sections 7 and 8 symmetrically in respect to the axial position of the plate 17. In this way the resonance frequencies of both modes can be shifted synchronously. It is of particular importance to move the pistons in the manner to keep the assembly resonant for the $TE_{012}$ mode, i.e. the resonance sections 7 and 8 must be symmetrical in respect to the half wavelength variations of the standing wave pattern of this mode.

Figure 4:
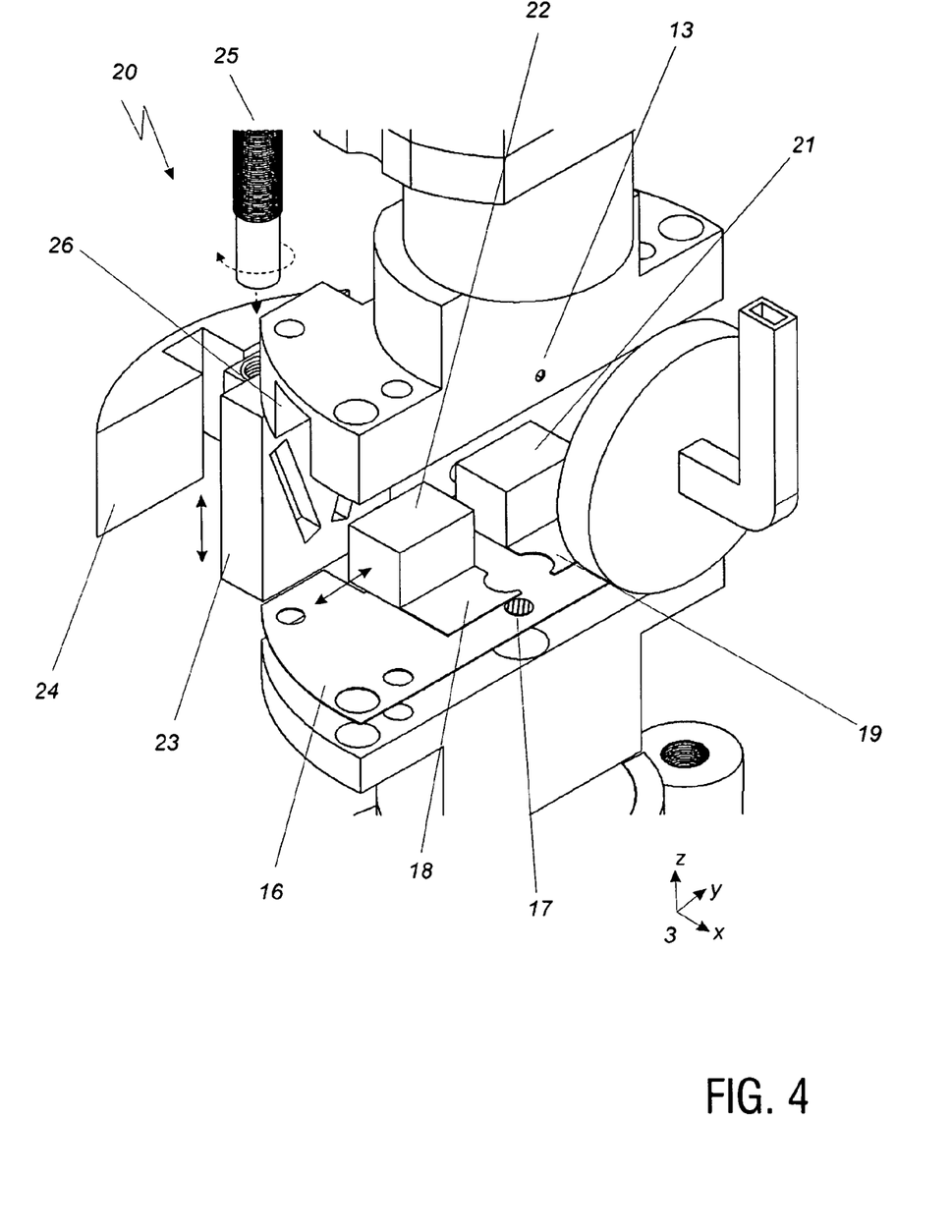
FIG. 4 a detailed view of the coupling unit between the resonance sections of the resonator.
Figure 5:
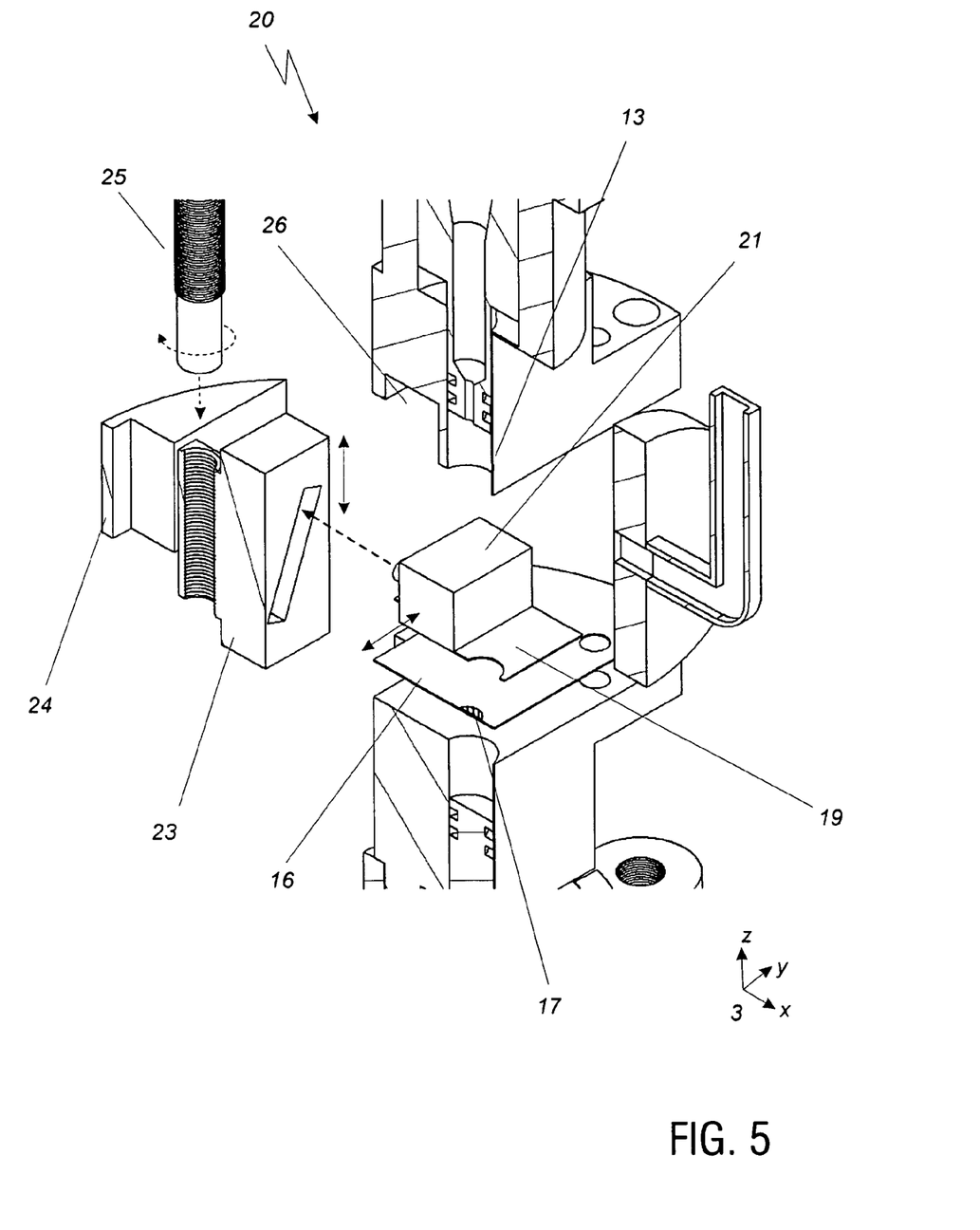
FIG. 5 a sectional view of the coupling unit in FIG. 4.

It is practically feasible to change, i.e. to reduce, the initial frequency difference of the modes by inserting the lateral metallic slabs 18 and 19 into the resonator (see FIGS. 4 and 5). In this way the frequency of the lower mode ($TE_{011}$) will be shifted to upper values, while the frequency of the $TE_{012}$ mode will be affected only slightly. This is due to somewhat different field profiles for both modes at the position where the slabs are inserted. Therefore, to avoid the degradation of the $TE_{012}$ mode and diminish the tuning effect for it, the slabs are inserted between the wings of the standing wave pattern of this mode, thus in the location of its magnetic field minimum, i.e. at the same axial position where the conducting plate 17 is placed.

The metallic slabs 18 and 19 are attached to the sliders 21 and 22. While rotating the shaft 25 the transmission slab 23 moves vertically parallel to the main axis 2. Transmission slab 23 is joined with the sliders 21 and 22 in the way that its vertical up/down movement leads to the movement of the sliders along the lateral axis y. Movement of the sliders 21, 22 and the slabs 18,19 is guided in the cavity 26 formed in the upper section 4. Both sliders, and therefore the slabs 18 and 19, move synchronously in opposite directions thus causing a shift of the resonance frequencies of both modes, however, the frequency of the lower mode will be shifted by much larger amount. The effect leads to the desired change of the frequency separation.

The presented embodiment of the dual-mode resonator has been tested on different samples with spin echo experiments performed at room and at low temperatures (down to 5 K). The frequency separation in the dual-frequency experiments has been varied in the range from 60 up to 350 MHz. Basically, the spin echo experiments can be conducted as conventionally known. According to the invention, the frequency spacing between first and second different microwave modes can be varied and electron spin resonance signals can be collected with changing frequency spacing.

Figure 8:
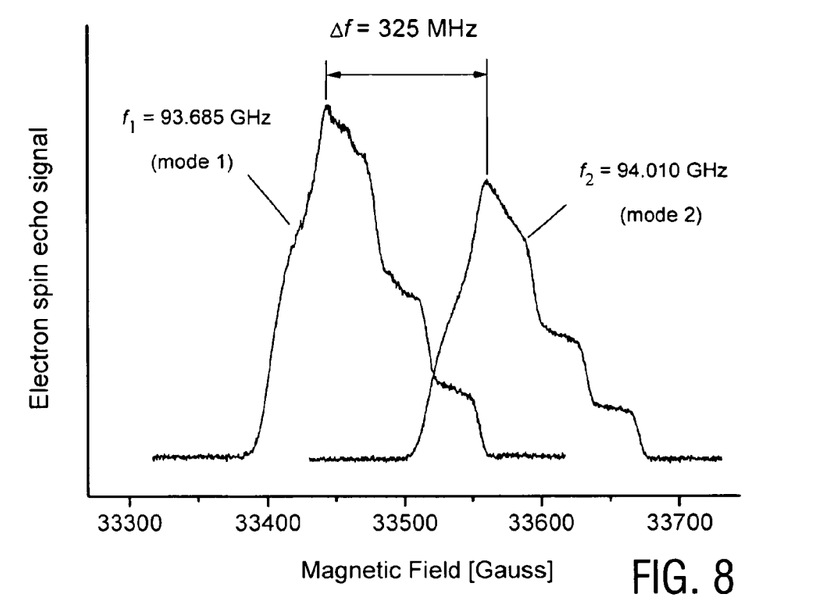
FIG. 8 the electron spin echo detected spectra of the nitroxide spin label in a ribonucleic acid molecule recorded at 70 K at the frequencies of the two different modes of the dual-mode resonator.

FIG. 8 demonstrates the electron spin echo-detected ESR spectra recorded on a ribonucleic acid (RNA) molecule specifically labelled by nitroxide radicals. The typical spectra of the nitroxide based radicals have been recorded at different static field positions in respect to different resonance frequencies of both microwave modes in the dual-mode resonator. Intensities of the spectra are scaled by the strengths of the microwave fields produced by each mode. The spectra were recorded at 70K and the frequency separation between the modes was set to 325 MHz.

Figure 9:
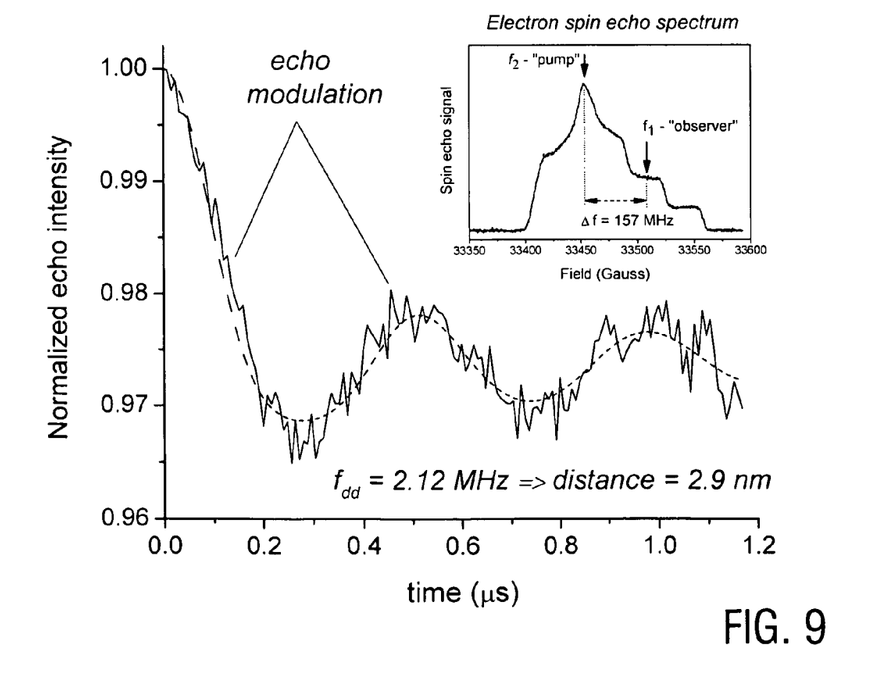
FIG. 9 the PELDOR (DEER) trace recorded on a model nitroxide based biradical (paraphenyleneethynylene) with the use of the dual-mode resonator.

In FIG. 9 the successful PELDOR (DEER) experiment performed with the use of the dual-mode resonator is presented. The dipolar evolution trace was recorded on a model biradical system in which two radicals are separated by a distance of 2.9 nm. The trace was recorded at 70 K with the 157 MHz separation of the "pump" and "detection" frequencies. The frequency separation corresponds to two orthogonal orientations of the molecules in the magnetic field. A Fourier transformation of the spin echo modulation yields a frequency of 2.119 MHz corresponding to a point dipole-dipole distance of 2.9 nm.

The features of the invention disclosed in the above description, the drawings and the claims can be of significance both individually as well as in combination for the realization of the invention in its various embodiments.

The invention claimed is:

1. A microwave resonator device, that is configured for electron spin resonance measurements, comprising:
    a resonator being simultaneously resonant with first and second microwave field modes and including a first and second resonance sections arranged along a longitudinal axis of the resonator, and
    a coupling unit being arranged between the first and second resonance sections, said coupling unit including a conducting plate being arranged on the longitudinal axis and covering a central portion of a cross-sectional area of the resonator,
    wherein:
    the conducting plate is arranged in order to adjust a first mode frequency of the first microwave field mode,
    the conducting plate is also arranged at a position corresponding to a field minimum of the second microwave field mode, whereby one of the first and second resonance sections is capable of accommodating a sample, and wherein the microwave resonator device is configured in order to allow an excitation of the sample at one frequency and a detection of an electron spin resonance response of the sample at another frequency.

2. The microwave resonator device according to claim 1, wherein the coupling unit further includes lateral conducting slabs surrounding the conducting plate so that a ring-shaped slit is formed between the first and second resonance sections.

3. The microwave resonator device according to claim 2, wherein the lateral conducting slabs are movable such that a radial width of the ring-shaped slit is adjustable.

4. The microwave resonator device according to claim 3, further comprising a drive unit that causes a synchronous adjustment movement of the lateral conducting slabs.

5. The microwave resonator device according to claim 1, further comprising at least one of a first adjustment piston arranged in the first resonance section, wherein frequencies of the first and second microwave field modes of the resonator depend on an adjustment position of the first adjustment piston in the first resonance section, and a second adjustment piston arranged in the second resonance section, wherein the frequencies of the first and second microwave field modes of the resonator depend on an adjustment position of the second adjustment piston in the second resonance section.

6. The microwave resonator device according to claim 5, further comprising a frequency setting device being arranged and configured for setting the adjustment position of at least one of the first and second adjustment pistons.

7. The microwave resonator device according to claim 6, wherein the frequency setting device is configured for a synchronous setting of the adjustment positions of both of the first and second adjustment pistons such that a frequency separation of the first and second microwave modes is a constant.

8. The microwave resonator device according to claim 5, wherein the first adjustment piston has a concentric opening in order to introduce a sample into the first resonance section.

9. The microwave resonator device according to claim 1, wherein one of the first or the second resonance sections includes a coupling iris being arranged and configured for connecting an incoupling waveguide with the first or second resonance section, wherein the coupling iris is located at a point where a microwave magnetic field strength induced in the first or second resonance section is at a maximum and has the same orientation as the magnetic field of a dominant mode in the incoupling waveguide.

10. The microwave resonator device according to claim 1, wherein the resonator has a cylindrical shape and the first and second resonance sections are cylindrical sections.

11. The microwave resonator device according to claim 1, wherein the conducting plate is arranged at a half longitudinal length of the resonator.

12. The microwave resonator device according to claim 1, wherein the conducting plate is arranged perpendicular to the longitudinal axis of the resonator.

13. The microwave resonator device according to claim 1, wherein the conducting plate has a diameter of at least 2.2 mm.

14. The microwave resonator device according to claim 1, wherein the conducting plate has a thickness below 200 μm.

15. A method of conducting an electron spin resonance measurement with a sample to be investigated, comprising the steps of:

positioning the sample in the first resonance section of the microwave resonator device according to claim 1, adjusting a first mode frequency of the first microwave field mode, adjusting a second mode frequency of the second microwave field mode, the second mode frequency being separated from the first mode frequency by a predetermined frequency spacing, exciting electron spin resonance signals in the sample, and collecting the electron spin resonance signals excited in the sample.

16. The method according to claim 15, further comprising the steps of:

varying the frequency spacing between first and second different microwave modes, and simultaneously collecting electron spin resonance signals from each of the first and second different microwave modes as the frequency spacing is varying.

* * * * *